(12) United States Patent
Chu et al.

(10) Patent No.: US 6,649,492 B2
(45) Date of Patent: Nov. 18, 2003

(54) STRAINED SI BASED LAYER MADE BY UHV-CVD, AND DEVICES THEREIN

(75) Inventors: Jack O. Chu, Manhasset, NY (US); Khaled Ismail, Giza (EG)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/073,562

(22) Filed: Feb. 11, 2002

(65) Prior Publication Data

US 2003/0153161 A1 Aug. 14, 2003

(51) Int. Cl.[7] .............................................. H01L 21/20
(52) U.S. Cl. ........................ 438/478; 438/479; 438/483; 438/459
(58) Field of Search ................................ 438/478, 479, 438/483, 464, 492, 503, 507, 493, 455, 459, 311, 197, 977

(56) References Cited

U.S. PATENT DOCUMENTS

| 5,298,452 A | 3/1994 | Meyerson | 438/508 |
|---|---|---|---|
| 5,371,037 A | 12/1994 | Yonehara | 438/459 |
| 5,461,243 A | 10/1995 | Ek | 257/190 |
| 5,659,187 A | 8/1997 | Legoues | 257/190 |
| 5,906,951 A | 5/1999 | Chu | 438/751 |
| 5,963,817 A | 10/1999 | Chu | 438/410 |
| 6,291,321 B1 * | 9/2001 | Fitzgerald | |
| 6,350,993 B1 * | 2/2002 | Chu et al. | |
| 6,410,371 B1 * | 6/2002 | Yu et al. | 438/151 |
| 2002/0072130 A1 * | 6/2002 | Cheng et al. | |
| 2002/0168864 A1 * | 11/2002 | Cheng et al. | |
| 2003/0025131 A1 * | 2/2003 | Lee et al. | |

FOREIGN PATENT DOCUMENTS

| WO | WO 99/53539 | * 10/1999 |
|---|---|---|
| WO | WO 01/99169 A | * 12/2001 |

* cited by examiner

*Primary Examiner*—Savitri Mulpuri
(74) *Attorney, Agent, or Firm*—George Sai-Halasz; Robert M. Trepp

(57) ABSTRACT

A method for fabricating a strained Si based layer, devices manufactured in this layer, and electronic systems comprising such layers and devices are disclosed. The method comprises the steps of growing epitaxially a SiGe layer on a substrate, and creating a varying Ge concentration in this SiGe layer. The Ge concentration in the SiGe layer includes a unique Ge overshoot zone, where the Ge concentration is abruptly and significantly increased. The Si based layer is epitaxially deposited onto the SiGe layer, whereby is becomes tensilely strained. It is also disclosed that the strained Si based layer, typically Si or SiGe, can be transferred to a different bulk substrate, or to an insulator.

27 Claims, 11 Drawing Sheets

STRAINED SI BASED LAYER MADE BY UHV-CVD, AND DEVICES THEREIN

FIELD OF THE INVENTION

This invention relates to a method of fabricating strained Si based layers of microelectronics quality. Furthermore it relates to the transfer of such strained layers to different substrates and also onto insulating materials. The invention additionally relates to devices made in these strained Si based layers and to electronic systems built with such devices.

BACKGROUND OF THE INVENTION

Today's integrated circuits include a vast number of transistor devices formed in a semiconductor. Smaller devices are the key to enhance performance and to increase reliability. As devices are scaled down, however, the technology becomes more complex and new methods are needed to maintain the expected performance enhancement from one generation of devices to the next. This relates mainly toward the primary semiconducting material of microelectronics, namely Si, or more broadly, to Si based materials. Such materials of promise are various SiGe mixtures, and further combinations, for instance with C. One of the most important indicators of device performance is the carrier mobility. There is great difficulty in keeping carrier mobility high in devices of the deeply submicron generations. A promising avenue toward better carrier mobility is to modify slightly the semiconductor that serves as raw material for device fabrication. It has been known, and recently further studied, that tensilely strained Si has intriguing carrier properties. A Si layer embedded in a Si/SiGe heterostructure grown by UHV-CVD has demonstrated enhanced transport properties, namely carrier mobilities, over bulk Si. In particular, a 90–95% improvement in the electron mobility has been achieved in a strain Si channel n-MOS (Metal Oxide Semiconductor transistor, a name with historic connotations for Si Field- Effect-Transistors (FET)) in comparison to a bulk Si n-MOS mobility. Similarly, a 30–35% improvements in the hole carrier mobility has been obtained for a strained Si channel p-MOS, in comparison to bulk silicon p-MOS. The great difficulty lies in the production of a layer of tensilely strained Si, or SiGe, that are of high enough crystalline quality, namely free of dislocations and other defects, to satisfy the exceedingly elevated demands of microelectronics.

However, if one achieves a material of sufficiently good quality and high carrier mobility, the underlying substrate may be a source of problems in as much as it can be a source of defects that eventually find their way into the good quality material on the surface. An additional potential area of concern may be the interaction of a semiconducting substrate with active devices on the surface. The underlying semiconducting substrate may introduce features which could limit harvesting the full advantage that a superior tensilely strained device layer would bestow. Often today's state of the art devices operate in a semiconducting layer which is separated from the semiconducting substrate by an insulating layer. This technology is commonly knows as SOI technology. (SOI stands for Si-on-insulator.) The standard method of producing SOI materials is called the SIMOX process. It involves the implantation of very high doses of oxygen ions at high energy into the semiconductor, and upon annealing, the oxygen forms an oxide layer under the surface of the semiconductor. In this manner one has a top semiconductor layer separated from the bulk of the substrate. However, the SIMOX process has many of its own problems that makes it unsuitable for the production of high mobility strained layers.

SUMMARY OF THE INVENTION

It is the object of this invention to show a method for producing a high crystalline quality Si based tensilely strained semiconductor layer on a substrate, typically a Si wafer. It is also disclosed how this Si based tensilely strained semiconductor layer can be transferred to another substrate, again most typically to another Si wafer, which is of higher crystalline quality than the substrate on which the strained Si based layer was produced. It is yet a further object of this invention to show how to transfer this Si based tensilely strained semiconductor layer on top of an insulating layer, making the Si based tensilely strained semiconductor suitable for building super-high performance devices.

There are numerous patents and publication relating to this subject. They cover some aspects of strained layer semiconductors, and some aspects of layer transfers and also elements of creating strained layers over insulators. But none teaches the full scope of this invention.

For example, U.S. Pat. No. 5,461,243 to B. A. Ek et al, titled "Substrate for Tensilely Strained Semiconductor" teaches the straining of one layer with another one grown on top of it, and sliding the bottom very thin Si layer on an $SiO_2$ layer. But this patent does not teach the present invention.

In U.S. Pat. No. 5,906,951 to J. Chu and K. Ismail, titled "Strained Si/SiGe layers on Insulator" incorporated herein by reference, there are a variety layers deposited to yield two strained channels. However this patent again does not teach the present invention.

U.S. patent application "Preparation of Strained Si/SiGe on Insulator by Hydrogen Induced Layer Transfer Technique" by D. Canaperi et al, filed Sep. 29, 2000, Ser. No. 09/675840, (IBM Docket no.: YOR920000345US1) incorporated herein by reference, teaches strain layer deposition and Hydrogen induced layer transfer (SmartCut), but it does not teach the present invention.

Formation of graded SiGe layers can proceed as described in U.S. Pat. No. 5,659,187 to LeGoues et al. titled: "Low Defect Density/arbitrary Lattice Constant Heteroepitaxial Layers" incorporated herein by reference.

The following patent and applications bear reference to both semiconductor strain layer formation and layer transfer. U.S. patent application "A Method of Wafer Smoothing for Bonding Using Chemo-Mechanical Polishing (CMP)" by D. F. Canaperi et al., Serial No. 09/675841 filed Sep. 29, 2000, (IBM Docket No.YOR920000683US1) incorporated herein by reference, describes surface polishing to reduce surface roughness in preparation to wafer bonding. U.S. patent application "Layer Transfer of Low Defect SiGe Using an Etch-back Process" by J. O. Chu, et al, Ser. No. 09/692606 filed Oct. 19, 2000, (IBM Docket No.YOR920000344US1) incorporated herein by reference, describes methods to create relaxed SiGe layers and to use an etch-back process for layer transfer. U.S. Pat. No. 5,963,817 to J. Chu et al, titled "Bulk and Strained Silicon on Insulator Using Local Selective Oxidation" incorporated herein by reference, teaches using local selective oxidation in a layer transfer process.

In all the embodiments of the invention the deposited layers change properties, such as Ge concentration, defect density, dopant concentration, strain state, in the direction of growth, or deposition. In the direction parallel with the surfaces the layers are all uniform. Accordingly, when there is reference that some quantity, for instance Ge concentration, has a variation, this is always meant mean a variation in the thickness direction. The term full thickness refers to the surface, or interface, of a layer where the layer has become fully deposited, or grown.

A typical embodiment of the present invention starts with a standard Si wafer or substrate. In some cases this substrate can have preparatory steps already performed on it for facilitating a layer transfer process to be performed after the layer deposition steps. Such a preparatory step can be, for instance, the creation of a porous layer in connection with the so called ELTRAN (Epitaxial Layer TRANsfer, a registered trademark of Canon K. K.) process. The ELTRAN process is described in U.S. Pat. No. 5,371,037 to T. Yonehara, titled: "Semiconductor Member and Process for Preparing Semiconductor Member", incorporated here by reference. A step-graded SiGe layer is deposited. The step-grading of Ge concentration substantially proceeds as in U.S. Pat. No. 5,659,187 to LeGoues et al. titled: "Low Defect Density/arbitrary Lattice Constant Heteroepitaxial Layers" incorporated previously by reference. The aim is to gradually change the lattice constant without having dislocations penetrating the top surface. Next, a relaxed SiGe buffer is deposited, which in this invention imbeds a unique Ge overshoot layer. The relaxed buffer is common in the process of creating epitaxial films, where due to lattice parameter mismatches there is considerable strain in the deposited films. This buffer, in which the Ge concentration is constant, is of sufficient thickness to diminish the likelihood that dislocations and other lattice defects penetrate from the step-grading layers to the layer of interest on the surface. The Ge concentration in the relaxed buffer is the same as the Ge concentration in the last step of the step-graded region.

It is an essential aspect of this invention that the relaxed buffer imbeds a Ge overshoot layer, or zone. This zone is characterized by an abrupt increase of the Ge concentration to a level above that of the Ge concentration in the relaxed buffer. The thickness of the Ge overshoot layer is only a fraction of the relaxed buffer thickness. The Ge overshoot layer is placed typically in the upper half of the relaxed buffer, namely nearer to that end of the relaxed buffer which touches the final strained Si based layer. This overshoot layer assures complete relaxation in the SiGe buffer. It also acts as a sink for lattice defects. A further role for the Ge overshoot layer can be found in some of the layer transfer schemes, where the overshoot layer serves selectivity purposes, in either etching, or as a layer for selective oxidation.

The relaxed buffer layer is followed by the final layer of Si, or SiGe (low Ge content) layer in which the high performance devices can then be built. This layer is virtually defect free due to the effect of the relaxed buffer which imbeds the Ge overshoot layer. The final Si base layer upon epitaxial deposition becomes tensilely strained as the result of the lattice mismatch between the high Ge concentration relaxed buffer surface and the pure Si, or low Ge concentration, high performance device layer.

Another differing embodiment of the invention is where the step-graded SiGe layer followed by the flat Ge concentration buffer layer is replaced by a linearly graded SiGe layer. The Ge concentration of this layer goes from zero at the interface with the substrate and to certain value at the full thickness of the layer. The aim is to gradually change the lattice constant without having dislocations penetrating the top surface. Again, as in the step-graded embodiment, it is an essential aspect of this invention that the linearly graded layer imbeds a Ge overshoot layer, or zone. This zone is characterized by an abrupt increase of the Ge concentration to a level above that of the highest Ge concentration in the linearly graded layer. The thickness of the Ge overshoot layer is only a fraction of the linearly graded layer thickness. The Ge overshoot layer is placed typically in the upper half of the linearly graded layer, namely nearer to that end of the linearly graded layer which touches the final strained Si based layer. This overshoot layer assures complete relaxation in the SiGe linearly graded layer. It acts as a sink for lattice defects, as well. A further role for the Ge overshoot layer can be found in some of the layer transfer schemes, where the overshoot layer serves selectivity purposes, in either etching, or as a layer for selective oxidation.

The linearly graded layer is followed by the final layer of Si, or SiGe (low Ge content) layer in which the high performance devices can then be built. This layer is virtually defect free due to the effect of the linearly graded layer which imbeds the Ge overshoot layer. The final Si based layer upon epitaxial deposition becomes tensilely strained as the result of the lattice mismatch between the high Ge concentration at the full thickness of the linearly graded layer surface and the pure Si, or low Ge concentration high performance device layer.

The two embodiments of the layer structures supporting the Si based strain layer in the following will be referred to as support structure. Accordingly the term support structure can mean either the step graded scheme with the relaxed buffer embodiment, or the linearly graded embodiment.

All the steps in creating the strained Si based layer in preferred embodiments are done by a UHV-CVD processes, and preferably in an AICVD system as described in U.S. Pat. No. 6,013,134 to J. Chu et al, titled: "Advance Integrated Chemical Vapor Deposition (AICVD) for Semiconductor Devices", incorporated herein by reference. The AICVD system is also capable to go beyond, in situ, of the Si based strained layer process and fabricate structures in the strained Si based layer. The UHV-CVD method, and in particular the AICVD system is well suited to handle the large diameter, 8 in or 10 in, Si wafers of today technologies, or the diameters that may becoming standards in the future. UHV-CVD poses no inherent limit onto the diameter of the wafers and layers to be processed. Those skilled in the art, however, will recognize that other UHV-CVD method may also be used to fabricate the desired strained Si based layer. Such methods may be LP (low pressure)-CVD, or RT (rapid thermal)-CVD.

The tensilely strained Si based layer enhances the transport for both holes and electrons in a silicon layer structure suitable for conventional CMOS, or bipolar device processing. In long channel MOS devices made in the strained Si layer grown on a relaxed 25% SiGe heterostructure has yielded electron mobilities of about 1000 cm$^2$/Vs and high field hole mobilities of well over 200 cm$^2$/Vs which represents an increase of about 95% and 35% respectively over electron and hole mobilities in bulk Si MOS.

In some embodiments all the layers contain a low percentage of C. Carbon serves as a retardant of dopant diffusion. In yet another embodiment the C is introduced only into the top tensilely strained Si based layer. In such an embodiment the top tensilely strained layer is: $Si_{1-b-c}Ge_bC_c$, where "b" and "c" represent Ge and C concentrations given as fractions.

In some embodiments of the invention the Si based tensilely strained semiconductor layer is transferred to a second substrate, most typically to another Si wafer. This second substrate can be of higher crystalline quality than the support structures on which the strained Si based layer was produced. Furthermore, the second substrate is advantageous from a heat conduction point of view because of its intimate contact with the strained Si based layer. In yet another embodiment the Si based tensilely strained layer is transferred onto an insulating layer, making the Si based tensilely strained semiconductor suitable for building super-high performance devices.

Once the proper layer stack is ready, with the high quality tensilely strained layer on the top, one can transfer this layer onto a semiconductor substrate, or to an insulator. This insulator typically is an insulating film, such as silicon dioxide, on top of a Si wafer. There a several ways known in the art that the transfer to either a semiconductor substrate, or to an insulator can be carried out. One is so called SmartCut (a registered trademark of SOITEC Corporation) technique, as described, for instance, in the referenced U.S. patent application Ser. No. 09/675840. In another embodiment the layer transfer can be accomplished with the so called ELTRAN (Epitaxial Layer TRANsfer, a registered trademark of Canon K. K.) process, as described in U.S. Pat. No. 5,371,037 to T. Yonehara, titled: "Semiconductor Member and Process for Preparing Semiconductor Member", incorporated here by reference. In another embodiment the layer transfer is accomplished by the CMP polishing, and etch-back process, as described, for instance, in the referenced U.S. patent application Ser. No. 09/692606. A potential difference in using the layer transfer process in this invention compared to application Ser. No. 09/692606 is that now the Ge overshoot layer can act as an etch stop by itself, but the discussed heavy B dopant layer in Ser. No. 09/692606 can be introduced in an embodiment of this invention as well.

BRIEF DESCRIPTION OF THE DRAWINGS

These and other features of the present invention will become apparent from the accompanying detailed description and drawings.

FIG. 1. Shows layer stacks that produce the Si based tensilely strained layer.

FIG. 2. Shows various embodiments and stages of layer transfers.

FIG. 3. Schematically shows FET devices fabricated in Si based tensilely strained layers.

FIG. 4. Schematically shows bipolar devices fabricated in Si based tensilely strained layers.

DETAILED DESCRIPTION OF THE INVENTION

Figure 1A:
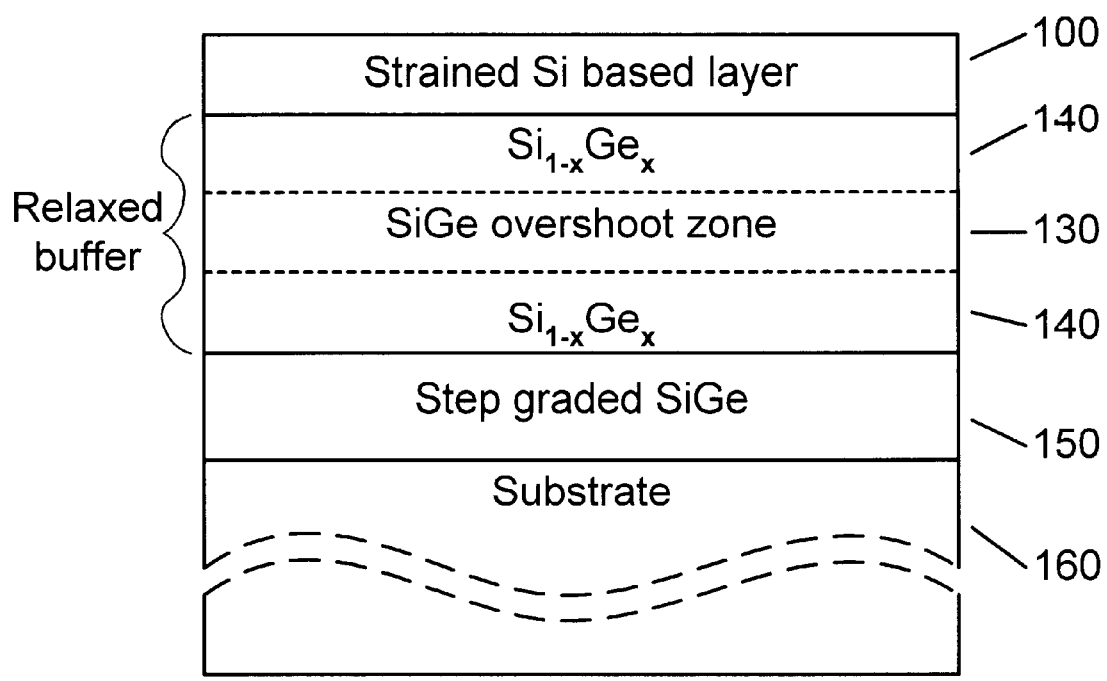
FIG. 1A shows a step graded scheme.

FIG. 1 Shows layer stacks that produce the Si based tensilely strained layer. FIG. 1A shows a step graded scheme. One starts with a semiconductor substrate 160, which is typically a regular Si wafer. In some embodiments this substrate can have preparatory steps already performed, for instance having a porous layer of silicon on its surface, or just subsurface for facilitating a layer transfer process to be performed after the layer deposition steps. For the porous layer subsurface means that after creating the porous layer on the surface, the top of the porous layer is recrystallized, effectively placing the porous layer subsurface by less than a few micrometers. The step graded SiGe layer 150 is deposited in an ultra high vacuum chemical vapor deposition (UHV-CVD) apparatus upon proper cleaning of the substrate surface. In a typical embodiment there would be four to five steps, in each step the Ge concentration would increase approximately 5%. The thickness of each step layer is between 50 nm and 300 nm, with the thickness of each step layer increasing with higher Ge concentrations. The Ge concentration of the last step is just that of relaxed buffer 140. Layers 140 form the relaxed buffer of prior art. The constant Ge concentration "x" typically in the 20–30% range in these layers. The combined thickness of all layers 140 is in the 1 to 2 $\mu$m range. In this invention the relaxed buffer imbeds a Ge overshoot layer, or zone, 130. In the overshoot zone the Ge concentration abruptly increases 5 to 10% over the value of "x". The thickness of the overshoot zone is in the 10 nm to 50 nm range. The advantages of having the overshoot layer are many. The overshoot layer helps the complete relaxation in the required SiGe buffer. It acts as a sink for lattice defects, so fewer reach to the top, sensitive strained layer. The overshoot layer helps through selectivity in the layer transfer step. The overshoot layer 130, can be either a selective etch stop, or etch enhancement layer, or a layer where oxidation, especially HIPOX oxidation proceeds rapidly. The last layer to be deposited is the aim of the present invention, layer 100 a tensilely strained Si based layer of superior crystal quality. The size of the strain depends on the composition and thicknesses of the underlying layer 140 and of the composition of the Si based layer itself. The tensile strain arises because the relatively high Ge concentration layer 140 has larger lattice spacings than the Si based top layer. The thickness of layer 100 is typically between 5 nm and 30 nm, preferably in the 10 nm to 15 nm range. The strained Si based layer 100 in some embodiments is simply pure Si. In other preferred embodiment it is a SiGe layer with Ge concentration typically below 10%. The strained Si based layer 100 may incorporate a low, less than 5%, concentration of C. The main role of C is to reduce dopant diffusion in the layer during subsequent device fabrication steps. Carbon may be incorporated in all deposited layers 150, 140, 130, and 100.

Figure 1B:
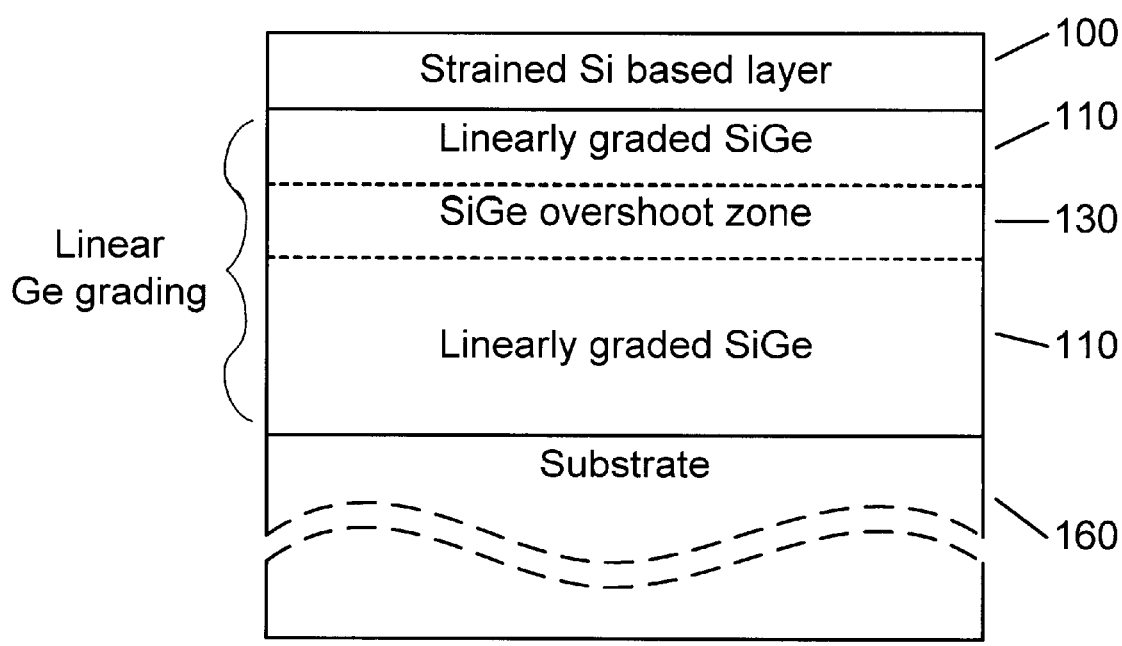
FIG. 1B shows a linearly graded scheme.

FIG. 1B shows fabrication of a same type of strained Si based layer as in FIG. 1A, but embodying a linearly graded scheme. In this embodiment the step-graded layer and relaxed buffer are replaced by a linearly graded concentration Ge layer. Again, one starts with a semiconductor substrate 160, which is typically a regular Si wafer. In some embodiments this substrate can have preparatory steps already performed, for instance having a porous layer of silicon on its surface, or just subsurface, for facilitating a layer transfer process to be performed after the layer deposition steps. In an ultra high vacuum chemical vapor deposition (UHV-CVD) apparatus upon proper cleaning of the substrate surface a linearly graded concentration Ge layer 110 is grown. The Ge concentration equals approximately zero at the bottom of the layer, at the interface with the substrate, and reaches Ge concentrations similar to that of the relaxed buffer of FIG. 1A, in the range of 20–30%. The total thickness of layers 110 is in the 1 to 3 $\mu$m range. In this invention the linearly graded Ge concentration layer imbeds a Ge overshoot layer, or zone, 130. In the overshoot zone the Ge concentration abruptly increases 5 to 10% over the maximum value of Ge concentration where the linearly graded layer reaches the interface with layer 100. The thickness of the overshoot zone is in the 10 nm to 50 nm range. The overshoot layer is placed near the full thickness of the linearly graded region, typically less than 500 nm from the interface with layer 100. The advantages of having the overshoot layer are many. The overshoot layer helps the complete relaxation in the required SiGe buffer. It acts as a sink for lattice defects, so fewer reaches to top sensitive strained layer. The overshoot layer helps through selectivity in the layer transfer step. The overshoot layer 130, can be either a selective etch stop, or etch enhancement layer, or a layer where oxidation, especially HIPOX oxidation proceeds rapidly. In the same manner as in FIG. 1A, with the step grading scheme, the last epitaxially deposited layer is the strained Si based layer. The thickness of layer 100 is typically between 5 nm and 30 nm, preferably in the 10 nm to 15 nm range. The strained Si based layer 100 in some embodiments is simply pure Si. In other preferred embodiment it is a SiGe layer with Ge concentration typically below 10%. The strained Si based layer 100 may incorporate a low, less than 5%, concentration of C. Carbon may be incorporated in all deposited layers 110, 130, and 100.

FIG. 2 Shows various embodiments and stages of layer transfers. FIG. 2A shows the step of wafer bonding to a bulk substrate. There are advantages to transfer the strained Si based layer to a new substrate, typically another Si wafer. This other Si wafer is of higher crystalline quality than the substrate on which the strained Si based layer was produced, because the high Ge concentration layers below the strained Si based layer contain more crystal defects than a high purity Si wafer. The region 280, the support structure, stands for either of the two described embodiments to fabricate the strained Si based layer 100, namely the step graded embodiment of layers 150, 140, and 130, or the linearly graded embodiment of layers 110 and 130. The strained Si based layer 100 is brought into intimate contact 200 with the substrate 230. Upon such intimate contact bonding occurs, since the surfaces always contain trace amounts of water and oxides, which suffice for bonding. After bonding all the first substrate 160 and all the layers 150, 140, and 130 are removed by methods known in the art, leaving layer 100 attached to a high quality substrate 230. The manner of removal of the unwanted layers has many embodiments known in the art, as detailed next in relation to FIG. 2B.

Figure 2A:
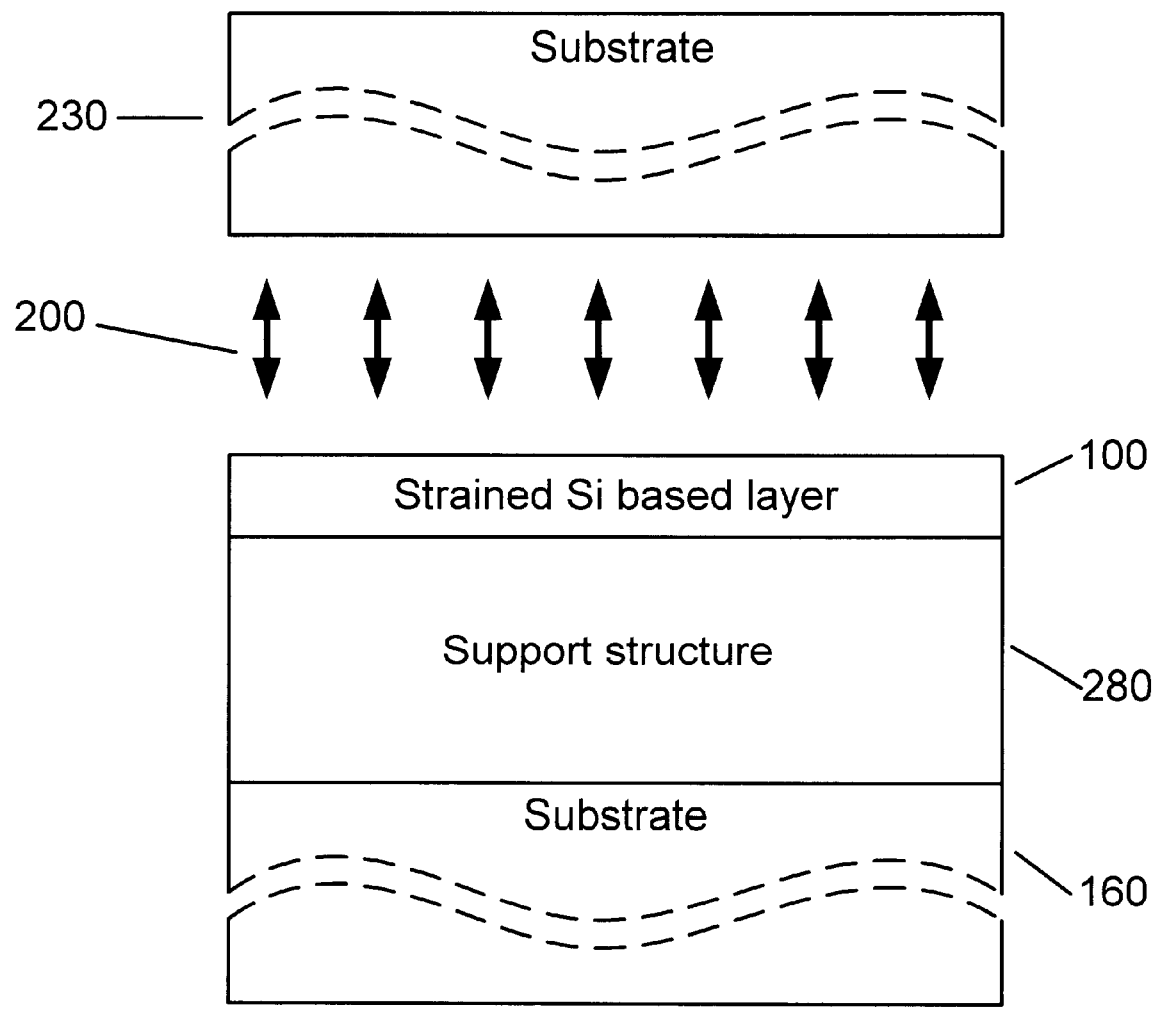
FIG. 2A shows the step of wafer bonding to a bulk substrate.
Figure 2B:
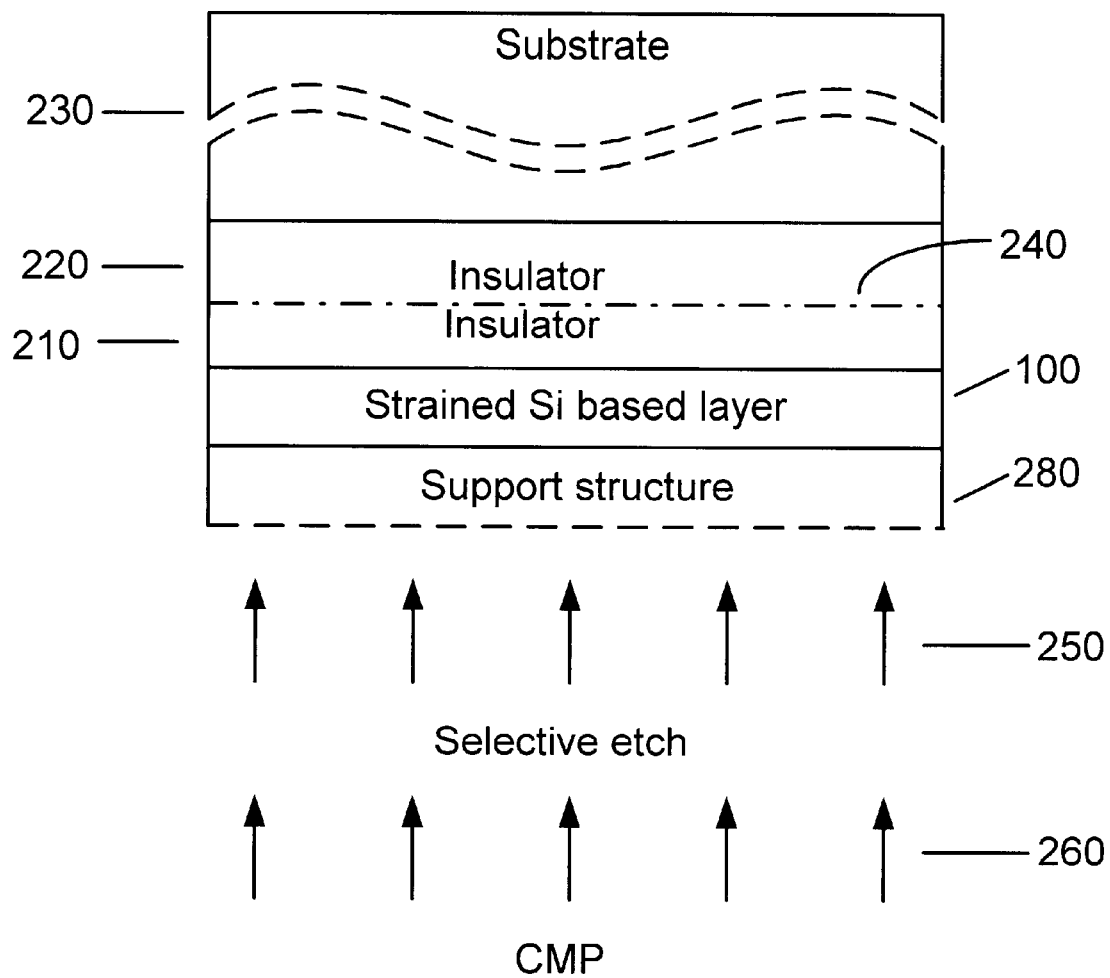
FIG. 2B shows the steps of CMP and etch back after bonding to an insulating layer.

FIG. 2B shows the steps of CMP and etch back after transfer to an insulating layer. On the layer stack of FIG. 1B an insulator 210 is deposited, or grown. In a preferred embodiment this insulator is an oxide layer grown on the strained layer 100. This insulator is brought into intimate contact 200 with another insulator layer 220, wherein this second insulator layer 220 is grown, or deposited, on another substrate 230. However, is some embodiments growth of either insulating layer 210 or 220 may be omitted. The substrate 230 is again most typically a Si wafer. This step is described in U.S. patent application "A Method of Wafer Smoothing for Bonding Using Chemo-Mechanical Polishing (CMP)" by D.F. Canaperi et al., Ser. No. 09/675841 filed Sep. 29, 2000, (IBM Docket No.YOR920000683US1) incorporated already. Apart of silicon-dioxide, other preferred insulator materials for layers 210 or 220 are silicon-nitride, aluminum-oxide, lithium-niobate, "low-k" material, "high-k" material, or combinations of two or more of said insulators. Each has its own advantages in various situations. Lithium-niobate is useful when devices in the strained layer have optical applications. The "low-k" material, and "high-k" material refer to materials with low or high dielectric constant relative to the dielectric constant of silicon-dioxide. Low-k materials can lead to high speed devices offering low capacitance. High-k materials are useful in memory applications. Silicon-nitride and aluminum-oxide can strengthen very thin silicon-dioxide films.

The CMP step 260 is described in the already referenced U.S. patent application Ser. No. 09/675841. The selective etch 250 step can proceed in various ways. There are enchants that preferentially etch layers containing Ge, or stop on layers containing Ge. Examples of such are KOH and EPPW. The Ge overshoot layer is very useful from etch selectivity point of view. Details of the selective etch techniques can be found in the already referenced application by J. O. Chu, et al, Ser. No. 09/692606 filed Oct. 19, 2000, (IBM Docket No.YOR920000344US1). FIG. 2B depicts a situation with the steps of CMP and selective etching are still in progress. Eventually all layers of the support structure 280 will be removed, leaving the strained channel 100 layer, on top of an insulator and a substrate 230. The insulator is the joining along the surface 240 of the two earlier discussed insulators 210 and 220.

Figure 2C:
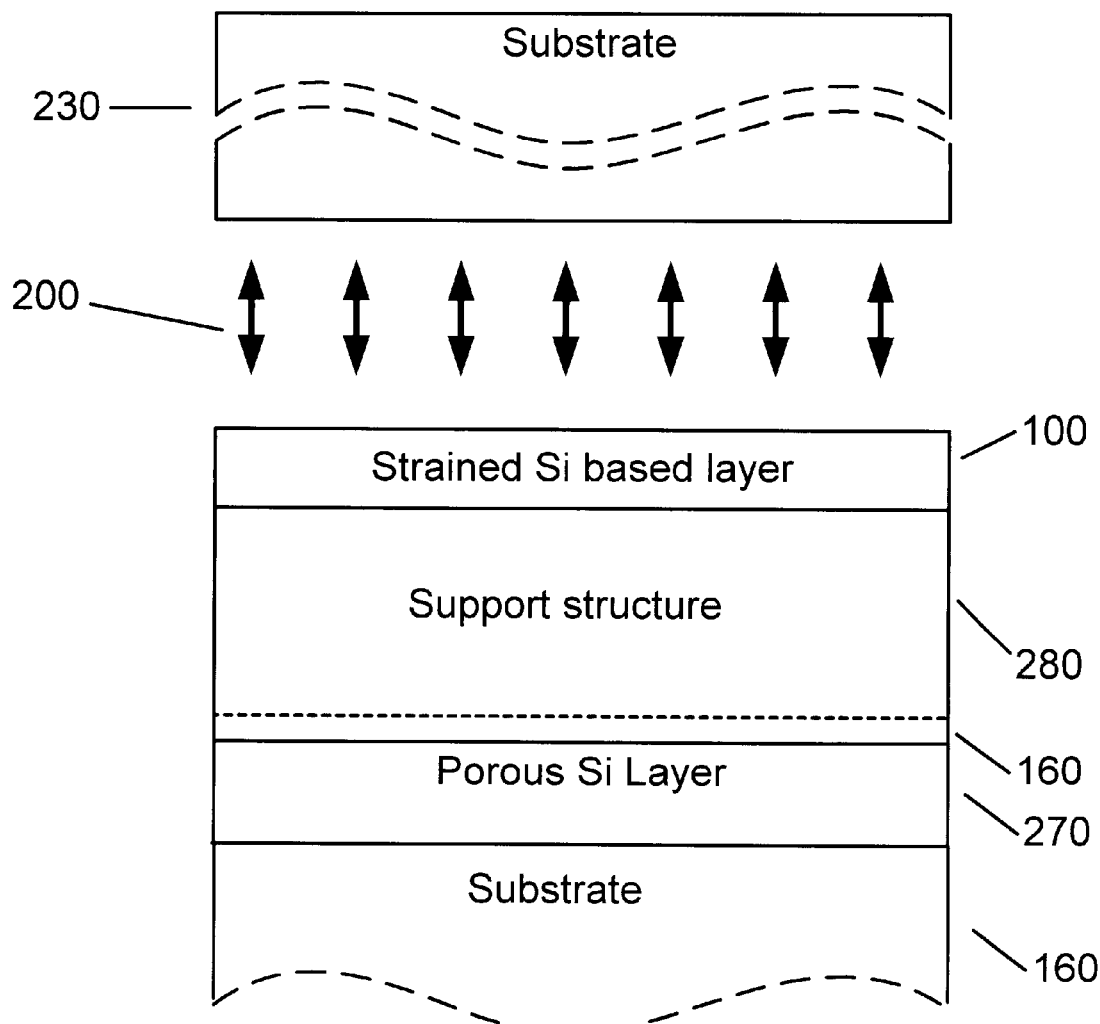
FIG. 2C shows the step of wafer bonding to a bulk substrate of an ELTRAN process.
Figure 2D:
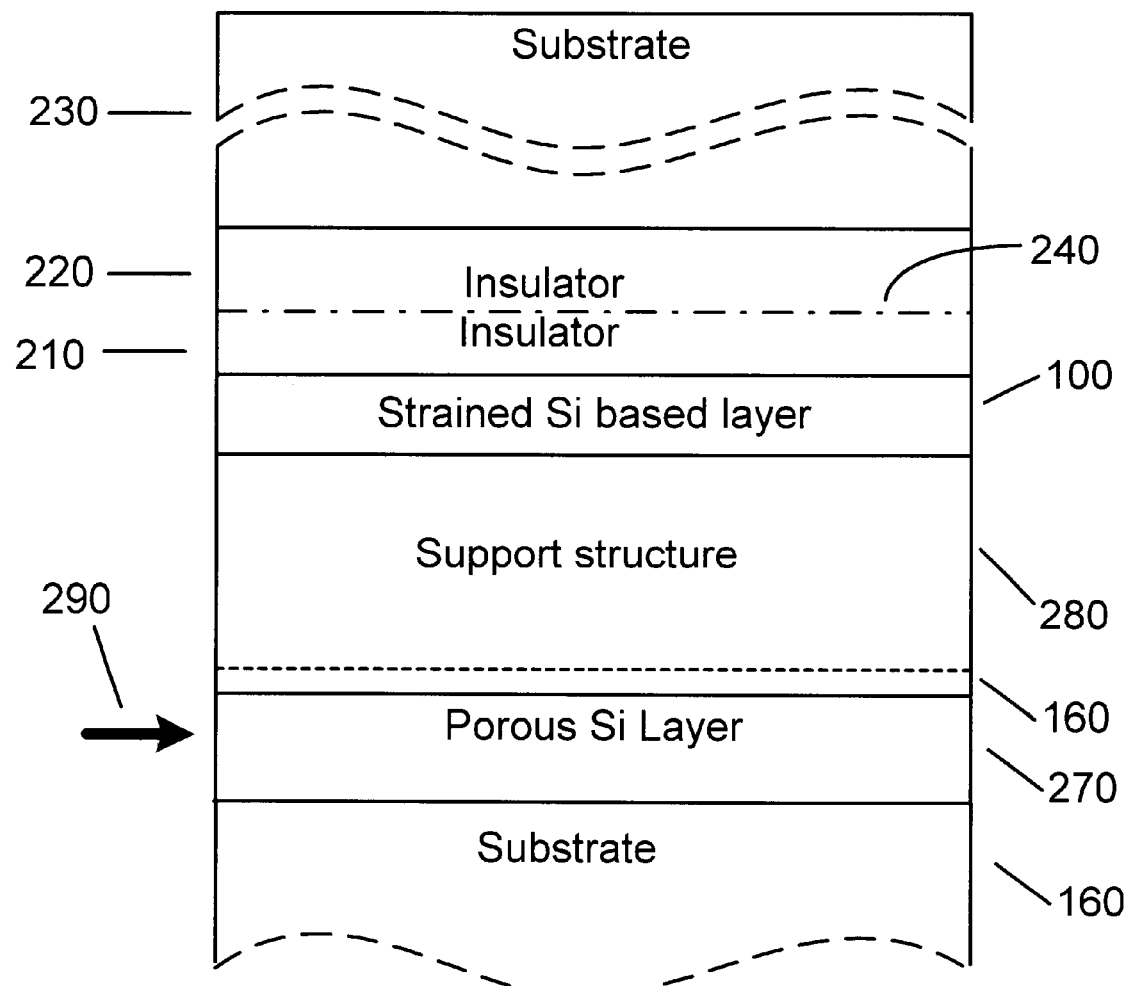
FIG. 2D shows a cleavage step of the ELTRAN process after bonding to an insulating layer.

FIGS. 2C and 2D schematically show layer transfer based on the ELTRAN process. FIG. 2C shows the step of wafer bonding to a bulk substrate of an ELTRAN process. This is similar to the step depicted on FIG. 2A. The strained Si based layer 100 is brought into intimate contact 200 with the substrate 230. Upon such intimate contact bonding occurs, since the surfaces always contain trace amounts of water and oxides, which suffice for bonding. The region 280, the support structure, stands for either of the two described embodiments to fabricate the strained Si based layer 100, namely the step graded embodiment of layers 150, 140, and 130, or the linearly graded embodiment of layers 110 and 130. The support structure 280 is grown on a porous Si layer 270. The creation of the porous layer on a substrate surface, or subsurface, 160 is known in the art. For the porous layer subsurface means that after creating the porous layer on the surface, the top of the porous layer is recrystallized, effectively placing the porous layer subsurface by less than a few micrometers. The dashed line substrate region 160 on FIG. 2C shows the possibility of a subsurface porous layer. FIG. 2D shows a cleavage step of the ELTRAN process after bonding to an insulating layer. This is similar to the step depicted on FIG. 2B, with the various layers described earlier. The arrow 290 indicates the step wherein the bulk of the substrate 160 is removed by using the weakness of the porous Si layer 270. The dashed line substrate region 160 on FIG. 2D shows the possibility of a subsurface porous layer. There are several ways known in the art to accomplish step 290, such as using a water jet, mechanical cleaving, or various other uses of force to break up the porous layer 270. The removal of the support structure 280 proceeds, again, by methods known in the art.

A further layer transfer scheme known in the art that can be used in various embodiments of this invention is the so called SmartCut, referenced earlier.

Figure 3A:
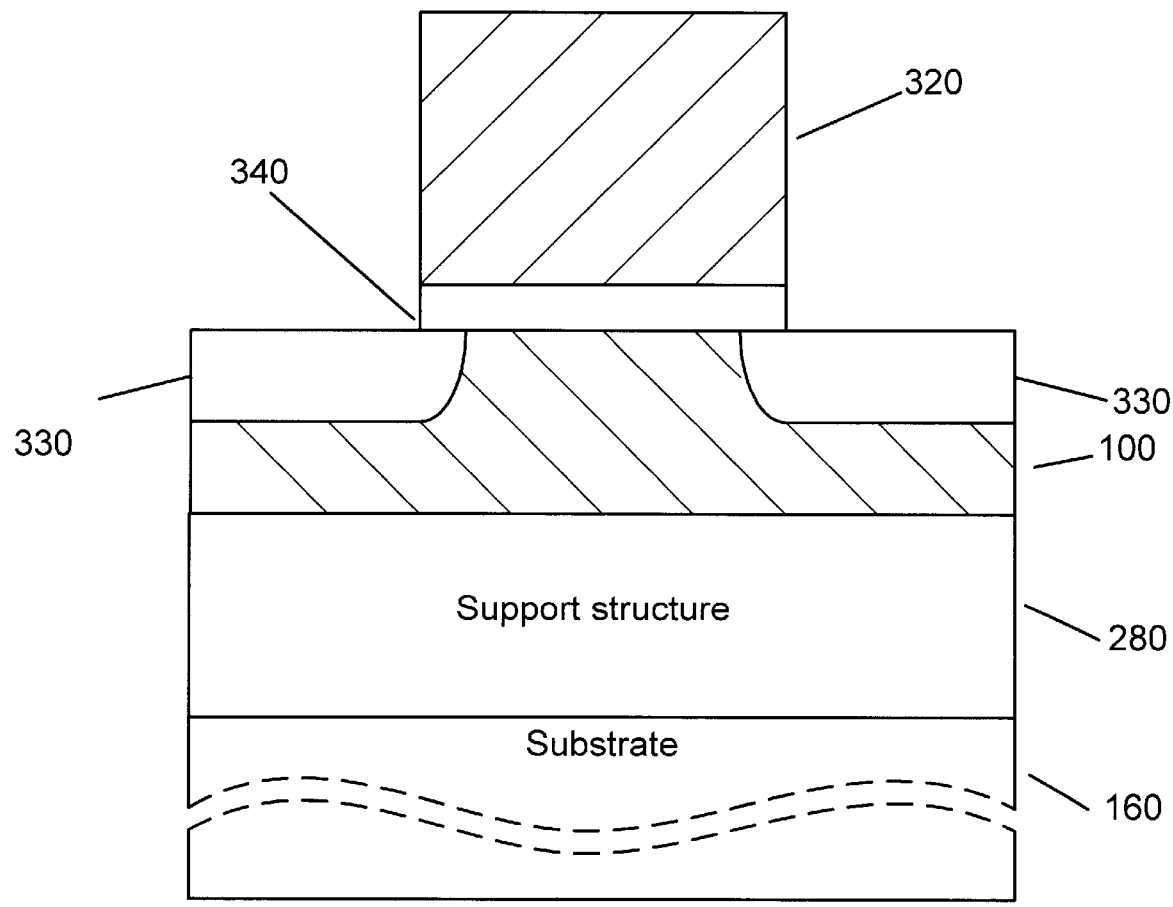
FIG. 3A shows the FET device in the layer without layer transfer.

FIG. 3 schematically shows an electronic device, an FET device, fabricated in the Si based tensilely strained layer. FIG. 3A shows the FET device in the layer without layer transfer, when the layer remained on the original substrate and on the support structure 280. The region 280, the support structure, stands for either of the two described embodiments to fabricate the strained Si based layer 100, namely the step graded embodiment of layers 150, 140, and 130, or the linearly graded embodiment of layers 110 and 130. One of the many devices that can take advantage of the tensilely strained Si based layer are the FETs. FETs, that have n-type and p-type versions are the basic building blocks of CMOS configuration technologies. The strained layer 100 now has a standard FET built into it, with source/drain regions 330, gate insulator 340 and gate 320.

Figure 3B:
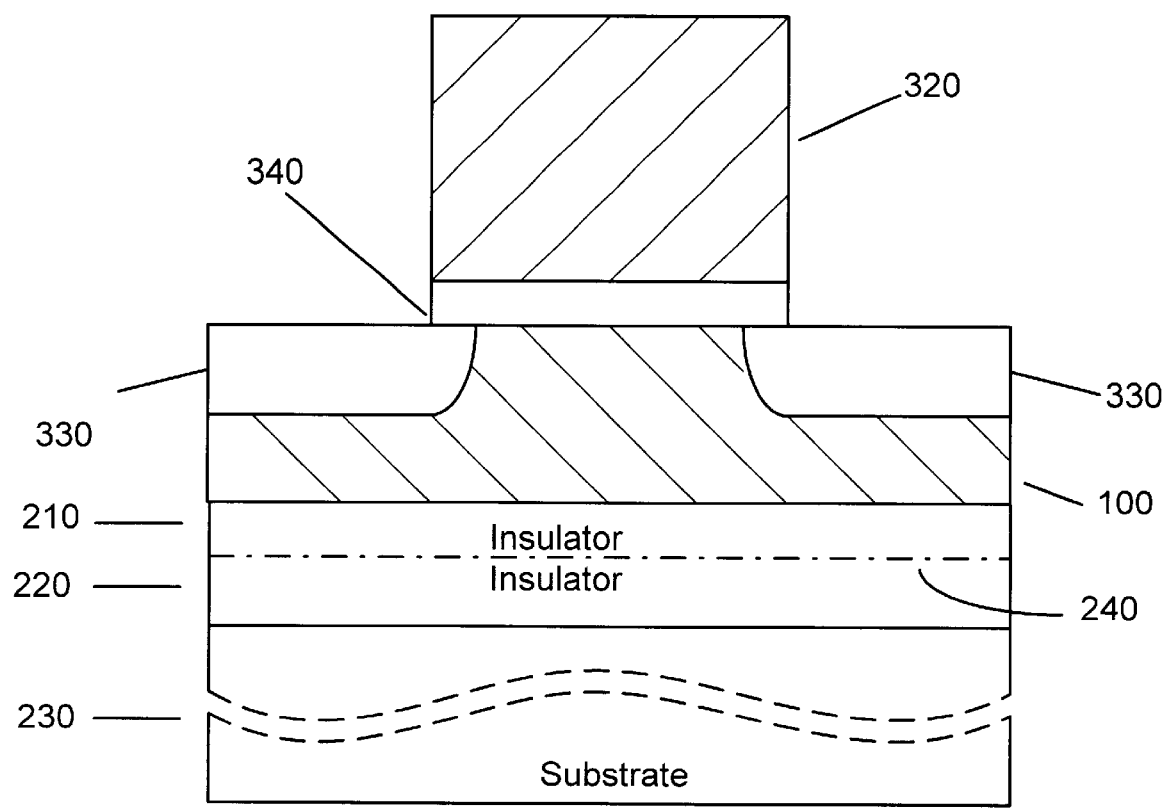
FIG. 3B shows the FET device in the layer after layer transfer.

FIG. 3B schematically shows an FET device fabricated in the Si based tensilely strained layer over an insulator, after layer transfer. FIG. 3B shows a device on an insulating layer, but this is not meant to be restrictive. If the strained silicon based layer had been transferred to a bulk substrate the same devices could be built into it. One of the many devices that can take advantage of the tensilely strained Si based layer are the FETs. FETs are the basic building blocks of CMOS technologies. The only substrate left now after the layer transfer, is the one which had the second insulating layer grow/deposited onto it 230. The insulator is now joining along a surface 240 of the original two insulators 210 and 220. However, is some embodiments growth of either insulating layer 210 or 220 may be omitted. The strained layer 100 now has a standard FET built into it, with source/drain regions 330, gate insulator 340 and gate 320.

FET devices as depicted in FIG. 3, can be interconnected in vast numbers to form circuits, digital processors, dynamic and static memories, display devices, communication systems, and other useful systems known in the art.

Figure 4A:
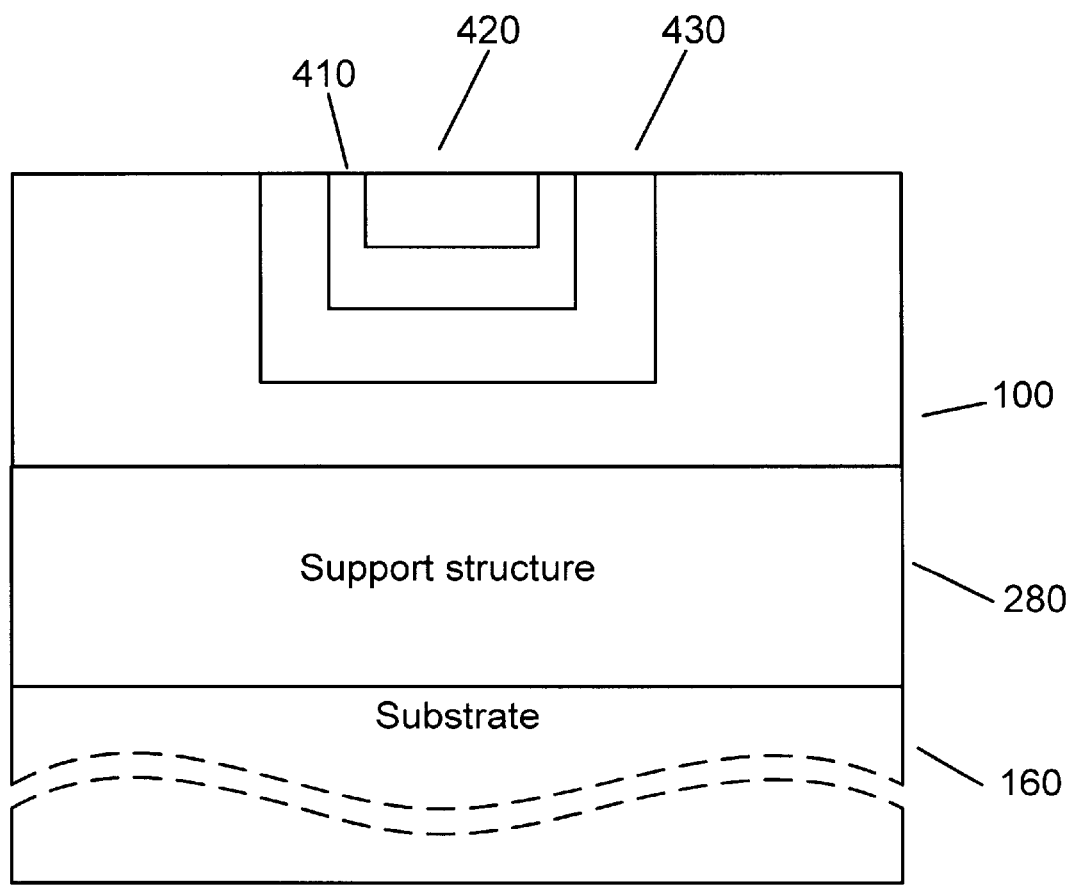
FIG. 4A shows the bipolar device in the layer without layer transfer.

FIG. 4 schematically shows an electronic device, a bipolar transistor device, fabricated in the Si based tensilely strained layer. FIG. 4A shows the bipolar device in the layer without layer transfer, when the layer remained on the original substrate and on the support structure 280. The region 280, the support structure, stands for either of the two described embodiments to fabricate the strained Si based layer 100, namely the step graded embodiment of layers 150, 140, and 130, or the linearly graded embodiment of layers 110 and 130. One of the many devices that can take advantage of the tensilely strained Si based layer are the bipolar transistors. The strained Si based layer 100 has a standard bipolar transistor built into it, with emitter 420, base 410, and collector 430.

Figure 4B:
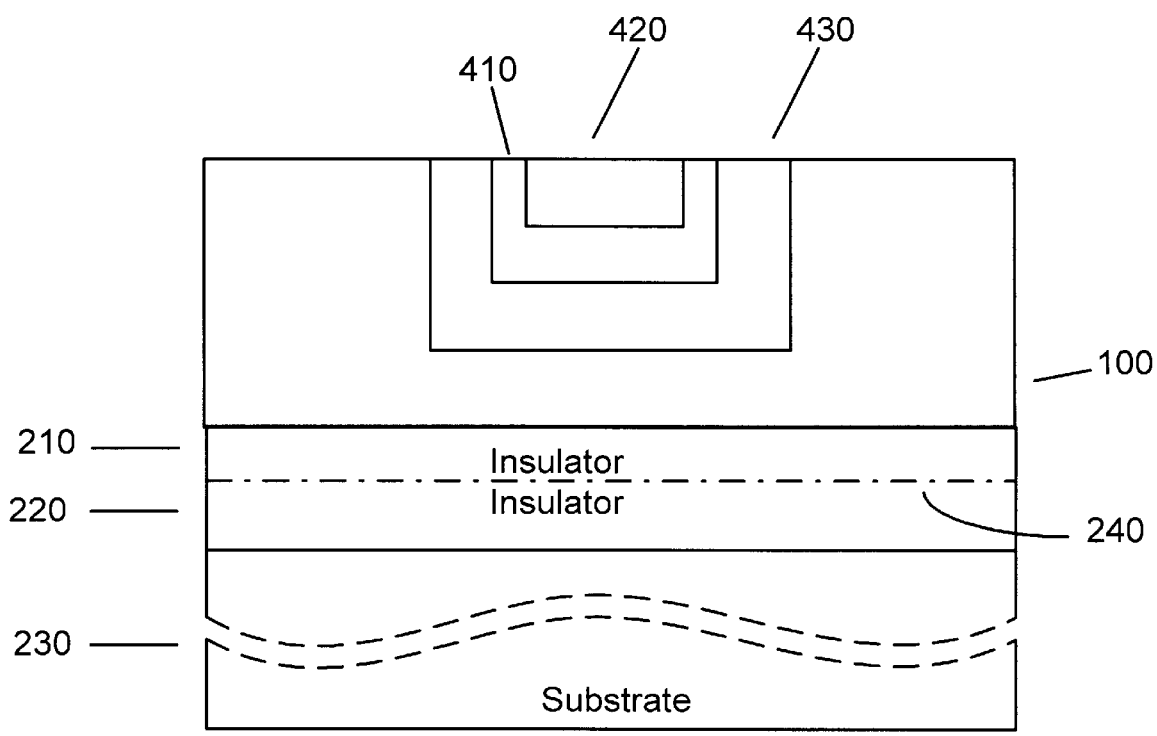
FIG. 4B shows the bipolar device in the layer after layer transfer.

FIG. 4B schematically shows a bipolar device fabricated in the Si based tensilely strained layer over an insulator, after layer transfer. FIG. 3B shows a device on an insulating layer, but this is not meant to be restrictive. If the strained silicon based layer had been transferred to a bulk substrate the same devices could be built into it. One of the many devices that can take advantage of the tensilely strained Si based layer are the bipolar transistors. The only substrate left now after the layer transfer, is the one which had the second insulating layer grow/deposited onto it 230. The insulator is now joining along a surface 240 of the original two insulators 210 and 220. However, is some embodiments growth of either insulating layer 210 or 220 may be omitted. The strained layer 100 now has a standard bipolar device built into it, with emitter 420, base 410, and collector 430.

Bipolar devices as depicted in FIG. 4, can be interconnected in vast numbers to form circuits, digital processors, dynamic and static memories, display devices, communication systems, and other useful systems known in the art. The bipolar and FET devices can be fabricated in next to each other in the Si based strained layer in a mixture of FET and bipolar devices, often referred to as BiCMOS, forming circuits and systems.

Figure 5:
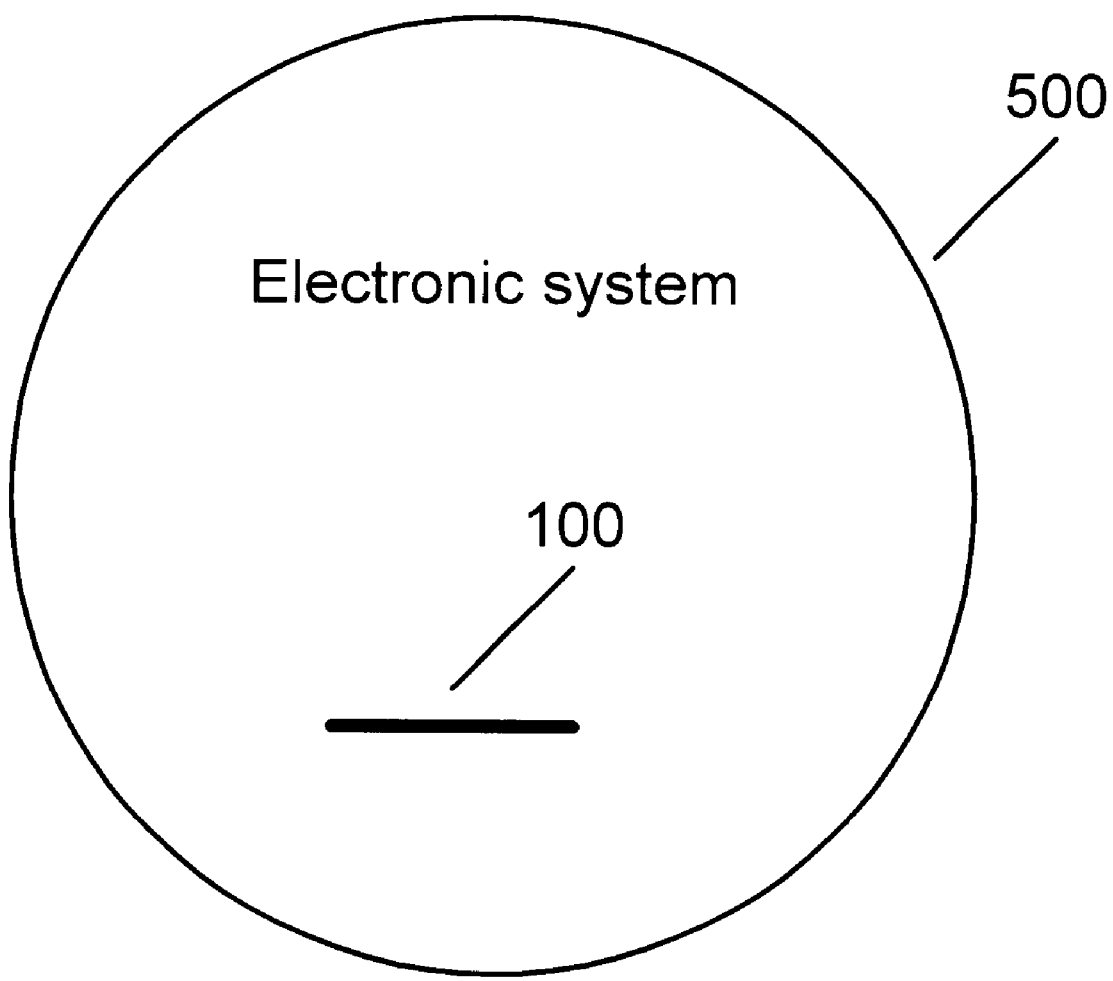
FIG. 5. Schematically shows an electronic system containing the Si based tensilely strained layer as its component.

FIG. 5. Schematically shows an electronic system containing the Si based tensilely strained layer as its component. In the figure the electronic system is shown generically as a sphere 500, comprising the Si based strained layer 100 and device structure therein.

Electronic systems that can take advantage of the high performance devices fabricated in the Si based strained layer are many. Such electronic systems in general are processors, digital processors, such as found in computing devices like computers, wireless and optical communication processors; analog processors, such as found in amplifiers; and mixed digital-analog processors, such as found in wireless and optical communication processors, and such as found in processors interconnecting computing devices with memories and interconnecting computing devices with each other in multiprocessors.

Many modifications and variations of the present invention are possible in light of the above teachings, and could be apparent for those skilled in the art. The scope of the invention is defined by the appended claims.

We claim:

1. A method for fabricating a strained Si based layer comprising the steps of:

growing epitaxially a SiGe layer on a substrate, wherein creating a varying Ge concentration in the thickness direction of said SiGe layer, said Ge concentration having a first value at the interface with said substrate and having a second value at full thickness of said SiGe layer, said second value of Ge concentration being larger than said first value of Ge concentration, furthermore said SiGe layer imbedding a Ge overshoot zone, wherein said Ge overshoot zone having a third value of Ge concentration, said third value being larger than said second value;

depositing epitaxially said Si based layer onto said SiGe layer; and transferring said strained Si based layer onto a second substrate.

2. The method of claim 1, wherein in said SiGe layer said varying Ge concentration has two regions: a step graded Ge concentration region, and a relaxed buffer region with a flat Ge concentration, said step graded region commencing at said interface with said substrate, said relaxed buffer region grown on top of said step graded region, furthermore said Ge overshoot zone being imbedded in said relaxed buffer region.

3. The method of claim 1, wherein in said SiGe layer said varying Ge concentration is a linearly graded concentration, furthermore said Ge overshoot zone being imbedded in said linearly graded concentration, an wherein said Ge overshoot zone is nearer to said full SiGe layer thickness than to said substrate.

4. The method of claim 1, wherein said strained Si based layer is a Si layer.

5. The method of claim 1, wherein said strained Si based layer is a SiGe layer.

6. The method of claim 1, wherein said strained Si based layer contains up to 5% percent of C.

7. The method of claim 1, wherein said substrate is a Si wafer.

8. The method of claim 7, comprising the step of creating a porous layer on the surface of said Si wafer.

9. The method of claim 7, comprising the step of creating a porous subsurface layer on said Si wafer.

10. The method of claim 1, wherein the thickness of said strained Si based layer is between 1 nm and 50 nm.

11. The method of claim 1, wherein the steps of said method are carried out in an AICVD system.

12. The method of claim 1, wherein said layer transfer step is an ELTRAN process.

13. The method of claim 1, wherein said layer transfer step is a bonding, CMP polishing, and etch-back process.

14. The method of claim 1, wherein said layer transfer step is a Smart-Cut process.

15. The method of claim 1, wherein said second substrate is a Si wafer.

16. The method of claim 1, wherein said second substrate has an insulating layer on its surface, and wherein said insulating surface layer receives said Si based strained layer during said layer transfer.

17. The method of claim 16, wherein said insulating layer is silicon-oxide, silicon-nitride, aluminum-oxide, lithium-niobate, "low-k" material, "high-k" material, or combinations of two or more of said insulators.

18. A method for fabricating a strained Si based layer on an insulator comprising the steps of:

growing epitaxially a SiGe layer on a substrate, wherein creating a varying Ge concentration in the thickness direction of said SiGe layer, said Ge concentration having a first value at the interface with said substrate and having a second value at full thickness of said SiGe layer, said second value of Ge concentration being larger than said first value of Ge concentration, furthermore said SiGe layer imbedding a Ge overshoot zone, wherein said Ge overshoot zone having a third value of Ge concentration, said third value being larger than said second value;

depositing epitaxially said Si based layer onto said SiGe layer; and transferring said strained Si based layer onto said insulator.

19. The method of claim 18, wherein in said SiGe layer said varying Ge concentration has two regions: a step graded Ge concentration region, and a relaxed buffer region with a flat Ge concentration, said step graded region commencing at said interface with said substrate, said relaxed buffer region grown on top of said step graded region, furthermore said Ge overshoot zone being imbedded in said relaxed buffer region.

20. The method of claim 18, wherein in said SiGe layer said varying Ge concentration is a linearly graded concentration, furthermore said Ge overshoot zone being imbedded in said linearly graded concentration, an wherein said Ge overshoot zone is nearer to said full SiGe layer thickness than to said substrate.

21. The method of claim 18, wherein said strained Si based layer is a Si layer.

22. The method of claim 18, wherein said strained Si based layer is a SiGe layer.

23. The method of claim 18, wherein said strained Si based layer contains up to 5% percent of C.

24. The method of claim 18, wherein said layer transfer step is an ELTRAN process.

25. The method of claim 18, wherein said layer transfer step is a bonding, CMP polishing, and etch-back process.

26. The method of claim 18, wherein said layer transfer step is a Smart-Cut process.

27. The method of claim 18, wherein said insulating layer is silicon-oxide, silicon-nitride, aluminum-oxide, lithium-niobate, "low-k" material, "high-K" material, or combinations of two or more of said insulators.

* * * * *